United States Patent

Sogawa

[11] Patent Number: 6,022,650
[45] Date of Patent: Feb. 8, 2000

[54] OVERLAY TARGET FOR PRECISE POSITIONAL DETERMINATION

[75] Inventor: Koichi Sogawa, Kobe, Japan

[73] Assignee: Ricoh Company, Ltd., Tokyo, Japan

[21] Appl. No.: 09/175,244

[22] Filed: Oct. 20, 1998

[30] Foreign Application Priority Data

Oct. 22, 1997 [JP] Japan ........................... 9-309266

[51] Int. Cl.$^7$ ........................................... G03F 9/00
[52] U.S. Cl. ........................ 430/22; 438/401; 382/151
[58] Field of Search ........................ 430/22; 438/401; 382/151

[56] References Cited

U.S. PATENT DOCUMENTS 4,309,813  1/1982  Hull ........................................... 430/22

OTHER PUBLICATIONS

P.R. Anderson et al.: SPIE vol.2196, pp. 383–388 (1994).
Ian Fink et al.: SPIE vol. 2196, pp. 389–399 (1994).
Yasushi Tanaka et al.: SPIE vol. 1926, pp. 429–439 (1193).

Primary Examiner—Christopher G. Young
Attorney, Agent, or Firm—Cooper & Dunham LLP

[57] ABSTRACT

An overlay target for the precision measurement is provided, including a substrate box formed over or in a substrate and a top box formed over the substrate box 13 and the substrate. The substrate box is of square with its side of 10 microns long. The top box is formed as a square opening composed of a layer of either a positive or negative type photo-resist with its side 10 microns long. These boxes are disposed rotated by 45° with respect to each other and the centers of the box marks are aligned during process steps to coincide with each other to thereby result in a minimal amount of displacement, if any, between the centers. Following the measurements of the lengths of the sections a, b, c and d, which are defined by the overlap between the top and substrate boxes on the confronting sides, amounts of displacement between the centers of the two boxes are determined using the relationships, $X_{reg}=(b-a)/4$ and $Y_{reg}=(d-c)/4$.

12 Claims, 3 Drawing Sheets

OVERLAY TARGET FOR PRECISE POSITIONAL DETERMINATION

BACKGROUND

1. Field

This patent specification relates to an overlay target and a method for determining the precision of mask alignment for optical lithography during semiconductor device fabrication processes or other projection printing.

2. Description

As semiconductor devices become more miniaturized, the demand for registration accuracy in photolithography is ever increasing.

The accuracy of mask alignment has been measured typically by patterning a resist pattern over a substrate pattern, measuring the positions both of the overlaid resist pattern and substrate pattern with an optical positioning measurement equipment and determining an amount of displacement of these patterns.

As an example of prior measurement methods a box-in-box method has been used, which is described hereinbelow, referring to FIGS. 1A through 1C.

FIG. 1A is a top view illustrating two boxes (or box marks) forming a box-in-box overlay target and FIG. 1B is a cross-sectional view taken along the line A–A' of the structure of FIGS. 1A. For use of a position measurement, a substrate box 3 is formed as a concave square on a substrate 1. An underlayer 5 of silicon oxide and/or other similar materials is subsequently formed over the substrate box 3 and the substrate 1. Furthermore, another box 7 of a photo-resist material is formed over the underlayer 5, having its sides shorter than those of box 3, to thereby be included in the substrate box 3 when viewed from above, as illustrated in FIG. 1A.

The overlay target for the precision measurement is therefore composed of inner and outer boxes 7 and 3, each having a side length of approximately from 10 to 40 microns and from 20 to 50 microns, respectively.

Using these box marks, mask alignment is measured as follows. (1) The positions of edge portions are observed for the substrate box 3 and top photo-resist box 7 with an optical positioning measurement equipment (i.e., overlay registration measurement system) within dotted areas 9 (FIG. 1C). (2) The dotted areas 9 of the substrate box mark 3 and resist box mark 7 are measured by scanning, and image data for each area 9 are inputted and then processed pixel by pixel to measure the position of the edge portions. By repeating this procedure for all of the eight dotted areas 9 of the substrate box 3 and resist box mark 7, the positions thereof are determined. (3) From the results obtained as above, center positions are determined for each of the substrate box mark 3 and top box mark 7, and a positional deviation between these two centers is determined.

However, this method has a disadvantage in that it takes a relatively long time to determine the positional deviation due to the repetition of measurements such as, for example, eight times in the above case.

Further, if the thickness of the underlayer 5a (FIG. 2B) is different from one edge portion to another on a substrate box 3a, the number of pixels counted for one edge portion may differ from that for another edge portion even when the box mark's centers coincide. Since the pixel number is taken to be related to the dimension during image signal processing, the difference in the pixel number mentioned above can result in reduced precision.

Still further, light may be incident on the box marks during optical measurements with its beam axis 10 not in parallel to a surface of the side edge of the resist box mark 7 (FIG. 2A), thereby forming a shadow on the face on the layer 5. This shadow may be recognized and then inputted as a part of the resist mask 7 by an overlay registration measurement system to possibly result in erroneous length values, which is known as a tool-induced shift (TIS) by optical measurement system in prior measurement methods. In addition, since beam focusing during the measurements is intended simultaneously for edges of both the substrate box mark 3 and resist box mark 7, it becomes difficult or sometimes not feasible to achieve contrasts satisfactory enough to recognize images, thereby possibly leading to a reduction in the reproducibility of measurements.

SUMMARY

It is therefore an object of the target and method described in this patent specification to provide a novel method and measurement system for positional determination using an overlay target, which overcome the above-noted difficulties.

It is another object to provide an overlay target and a method capable of determining the precision of mask alignment with improved accuracy and reproducibility in optical lithography processes used in semiconductor device fabrications.

To achieve the foregoing and other objects, and to overcome the shortcomings discussed above, an overlay target for the precision measurement is provided, including a substrate box (or box mark) formed over or in a substrate and a top box formed over the substrate box and the substrate. The substrate box mark is of a square shape with its side 10 microns long, while the top box mark is formed as a square opening of a layer of either a positive or negative type photo-resist, having its side 10 microns long. These box marks are disposed rotated by 45° with respect to each other and the centers of the box marks are aligned during process steps such that the centers thereof coincide with each other to thereby result in a minimal amount of displacement, if any, between the centers. In addition, by disposing these marks as mentioned above, four sections are formed on the sides of the box marks, which are defined by the overlap between the top and substrate box marks.

A method of the precision determination using the box marks is also disclosed. The dimensions of the above-mentioned four sections on the confronting sides are measured to obtain side lengths a and b used to calculate displacement along the x-axis, and the lengths c and d used to calculate displacement along y-axis, respectively. Subsequently, the amounts of displacement between the centers of two overlapping box marks (or deviation in the box mark registration) is determined from the lengths obtained as above using the relationships, $$X_{reg}=(b-a)/4 \text{ and } Y_{reg}=(d-c)/4.$$

As aforementioned, the top box mark is formed in this example as a square opening over a substrate box mark and lengths of confronting side sections are measured by focusing an optical positioning measurement equipment on the substrate box mark. Since the areas which include side sections generally have optical contrasts different from the areas having an overlying portion of the top box mark to other areas without such a portion, the precision measurements can be made with an excellent contrast, to thereby be capable of determining the accuracy of mask alignment with an improved reproducibility, which is advantageous in optical lithography processes during semiconductor device fabrications and other similar process steps.

BRIEF DESCRIPTION OF THE DRAWINGS

Preferred embodiments are described hereinbelow with reference to the drawings wherein.

DESCRIPTION OF THE ILLUSTRATIVE EMBODIMENTS

Figure 1A:
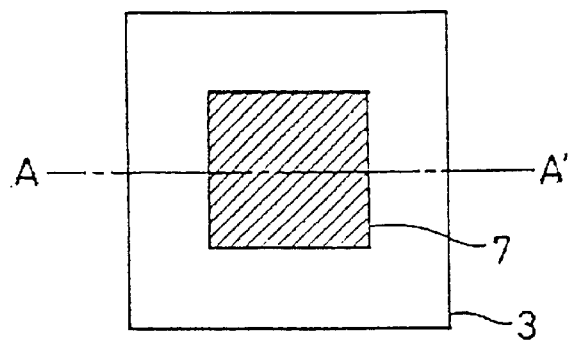
FIG. 1A is a top view illustrating a prior overlay target used for precision determination of mask alignment.
Figure 1B:
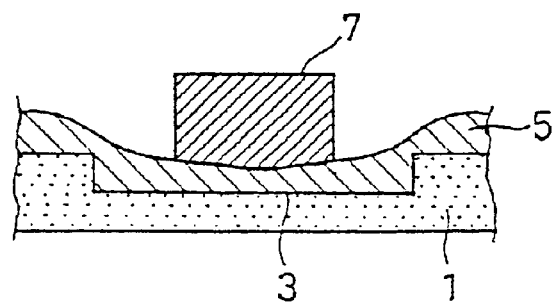
FIG. 1B is a cross-sectional view taken along the line A–A' of the structure of FIG. 1A.
Figure 1C:
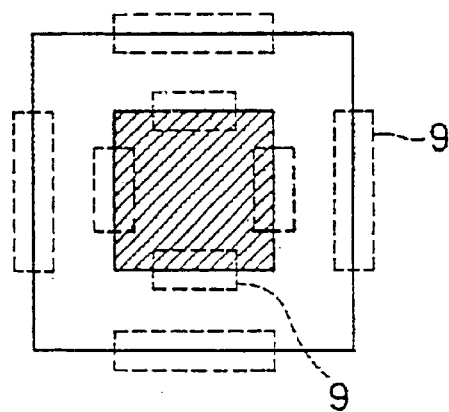
FIG. 1C illustrates edge portions of the structure of FIG. 1A for which precision measurements are carried.

In the description which follows, specific embodiments useful in precision measurements during semiconductor device fabrications, are described. It is understood, however, that the present invention is not limited to these embodiments. For example, it is appreciated that the overlay target and a method of measurements therewith disclosed herein are also adaptable to any form of precision measurements. Other embodiments will be apparent to those skilled in the art upon reading the following description.

Accordingly, an overlay target and a method therewith are provided, capable of measuring the displacement in mask alignments with an improved precision and reproducibility.

In one embodiment, an overlay target for the precision measurement is formed, including a square substrate box mark (or substrate box) formed over or in a substrate and a top box mark (or top box) composed of a photo-resist layer, which is formed over the substrate box mark and the substrate. The top box is similar in its shape to that of the square substrate box pattern, and disposed such that the former is rotated by 45° with respect to the latter and the centers of both box marks are located at approximately the same position. The precision measurement is carried out for the lengths of a plurality of sections which are defined by the overlap between the substrate and overlying top box marks. For the present overlay target, there are generally found four sections when viewed from above.

A method of determining the precision of mask alignment is provided using the overlay target in the present embodiment, wherein the dimensions of the above-mentioned four sections are each measured; an amount of displacement between the centers of the two overlapping square box marks in the x-axis is obtained from the difference between two lengths measured for the confronting sides of the overlapped box marks on the x-axis, and wherein another amount of displacement in the y-axis is similarly obtained from the difference between other two lengths measured for the confronting sides on the y-axis.

The precision measurements are carried out with an optical positioning measurement equipment (i.e., overlay registration measurement system), by scanning firstly for two areas which include each an area of overlap between the two box marks on the confronting sides on the x-axis and secondly for two areas on the confronting sides on the y-axis, inputting image data for these areas, processing the image data to resolve into a plurality of pixels having graded optical densities to correspond the lengths of the side section, obtaining the lengths of the side sections (a, b, c and d), and subsequently calculating the amounts of displacement between the centers of the two overlapping box marks.

It may be noted that, by "overlap" between two box marks, it is meant that at least a portion of one of the two box marks is placed over the other. In addition, each of the box marks may be formed as a convex square with residual layer portions as well as a square opening (or concave square) aforementioned.

The amount of displacement in the pattern registration, $X_{reg}$ and $Y_{reg}$ along the x- and y-axes, respectively, are subsequently calculated according to the following relationships, $$X_{reg}=(b-a)/4 \text{ and } Y_{reg}=(d-c)/4,$$

wherein b and a are the aforementioned lengths of confronting side sections on the x-axis, and d and c are similarly the lengths on the y-axis.

With an optical positioning measurement equipment, two areas on the x-axis are scan measured, which include each an area of the overlap between the box marks on the confronting sides, to obtain the lengths b and a, and subsequently two areas are measured on the y-axis to obtain d and c in a similar manner. An amount of the displacement between the centers of the two overlapping box marks is then determined from the length values obtained just above using the above formulae.

In the present embodiment, the top box mark is formed as a square opening over a substrate box and lengths of confronting side sections are measured by focusing an optical positioning measurement equipment on the substrate box.

Since the areas which include side sections generally have optical contrast different from the areas having an overlying portion of the top box mark to other areas without such a portion, the precision measurements can be carried out with an excellent accuracy and reproducibility.

The following example is provided to further illustrate preferred embodiments.

EXAMPLE

Figure 3:
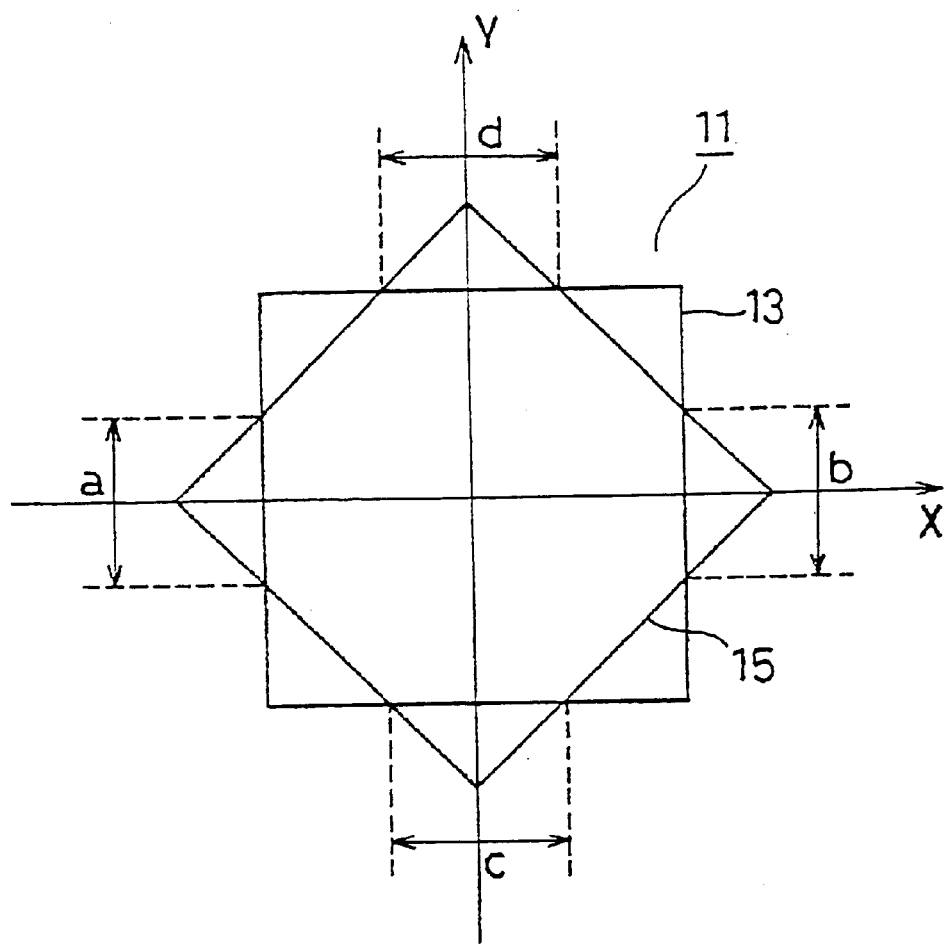
FIG. 3 is a top view illustrating an overlay target according to one embodiment disclosed herein, wherein the lengths of side sections are defined by the overlap between a substrate box and an overlying top box to be used for determining an amount of displacement.

Referring to FIG. 3, an overlay target 11 for a precision measurement was formed, including a substrate box mark 13 formed on a substrate and a top box mark 15, having an underlayer of silicon oxide and the other similar materials which was previously disposed over the substrate box 13 and the substrate.

The substrate box mark 13 was formed as a square, being concave toward the substrate and having its side 10 microns long. Over the substrate box mark 13, the top box mark 15 was formed as a square opening, having its side 10 microns long, which was composed of a layer of either a positive or negative type photo-resist, having the underlayer of silicon oxide. The top and substrate box marks 15,13 were disposed such that the box marks were rotated by 45° with respect to each other and the centers of the box marks were both located at approximately the same position.

It should be noted that these box marks are aligned during process steps such that the centers thereof coincide with each other to thereby result in a minimal amount of displacement, if any, between the centers.

Although the substrate box mark 13 was formed concave, the box mark may also be formed convex. In addition, although the top box mark 15 was formed as a square opening as mentioned earlier, the box may also be formed a convex square, having an approximately same side length as that of the substrate box 13. When a registration error of at most 0.5 micron is assumed during lithography processes, the dimension of the square pattern is preferably about 5 microns×5 microns.

In connection with the confronting sides of the box mark 13 on the x-axis, the lengths of side sections which are defined by the overlap of the box 13 with the overlying top box 15, are respectively taken as b and a (FIG. 3). Similarly, the lengths on the y-axis are taken as d and c.

When the center of the top box 15 is displaced from that of the substrate box 13 towards right in FIG. 3, there result an increase in the length b and a decrease in the length a. In a similar manner, when the center is displaced upwards in FIG. 3, d increases, while c decreases.

A method of precision determination of mask alignment of the present embodiment will be detailed hereinbelow.

Referring to FIG. 3, the lengths a, b, c and d were each measured, firstly. The measurements were carried out in such a manner that (1) four areas each including the sections a, b, c and d were measured by scanning with an optical positioning measurement equipment (i.e., overlay registration measurement system) and observed image data for each area were inputted, (2) image data in the area including the section "a" were subsequently processed to resolve the image data into a plurality of pixels having graded optical densities to distinguish the pixels which correspond to the section "a", to thereby obtain the length a, which originated from the aforementioned overlap between the substrate box 13 and the overlying top box 15 on the x-axis, and (3) by repeating this procedure for all other areas including sections b, c and d, the lengths b, c and d were obtained.

As mentioned earlier, the top box 15 was formed as a square opening composed of a layer of either a positive or negative type photo-resist in the present embodiment. Therefore, clear images of the section areas could be obtained with an excellent contrast through focusing the optical positioning measurement equipment on the substrate box 13.

From the length values thus obtained, the amount of displacement in the pattern registration were calculated according to the following relationships, $$X_{reg}=(b-a)/4 \text{ and } Y_{reg}=(d-c)/4,$$

wherein $X_{reg}$ and $Y_{reg}$ are the amount of the displacement of the center of the top box 15 with respect to that of the substrate box 13, along the x- and y-axis, respectively.

Although the precision measurements in the present embodiment were carried out for the lengths of the sections on the substrate box 13 resulting from the overlap with the top box mark 15, the measurements may also be made for the lengths on the top box 15 resulting from the overlap with the substrate box 13, wherein locations of intersecting points of the sides between these two box marks are utilized to obtain the lengths which correspond the above-mentioned side lengths.

Furthermore, although the top box 15 was formed as a square opening in the present embodiment as mentioned earlier, it may also be formed as a convex square composed of residual layer portions of photo-resist materials.

As described hereinabove, the precision measurements of the present embodiment can be accomplished by observing and data processing for four areas each including the section of the square box marks, to thereby be able to reduce the time needed for the measurement. This is advantageous over prior methods previously described wherein eight regions have to be measured.

Figure 2A:
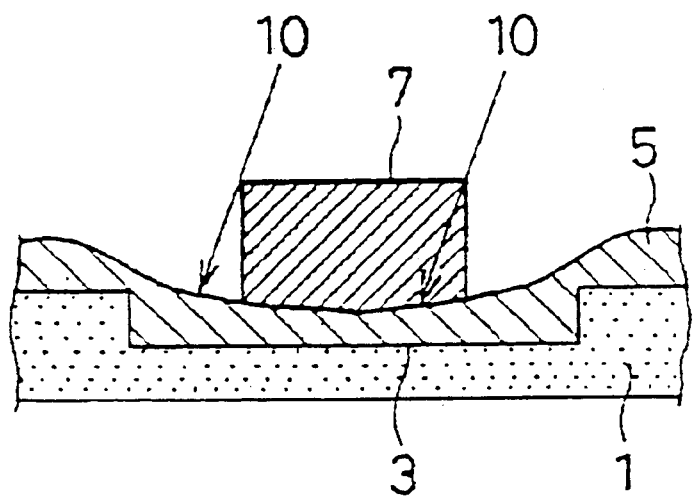
FIG. 2A illustrates a prior overlay target including an underlayer formed, wherein the thickness of the underlayer may be different from one edge portion to another.
Figure 2B:
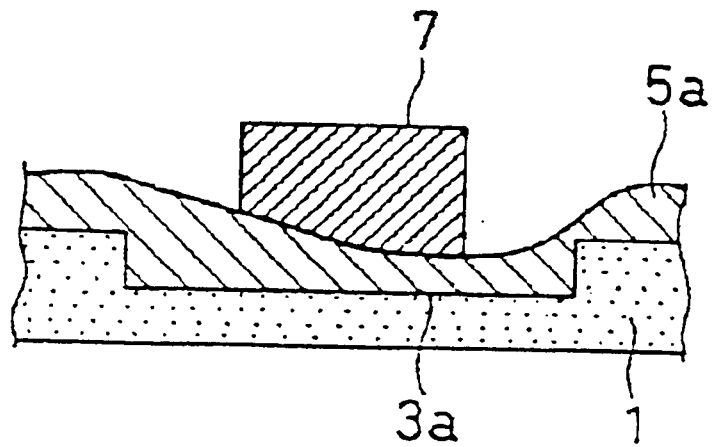
FIG. 2B illustrates light beams which are incident on a box mark during optical measurements, with their beam axes not in parallel to a surface of the side edge of a top box mark.

In addition, by focusing an optical positioning measurement equipment on the substrate box mark 13 through the opening of the top box of a photo-resist layer in the present embodiment, clear images of the section areas can be obtained with an excellent contrast. This is also true even for such a case of the box mark which is formed over an underlayer 5a (FIG. 2A) and having an partially underlying layer composed of metal, for example, on a substrate, wherein the thickness of the underlying layer 5a may be different from one edge portion to another on a substrate box mark 3a, which may generally result in a reduced precision.

Furthermore, a shadow may be formed on the face on the layer 5 by light incident on the patterns with its beam axis not in parallel to a surface of the side edge of the top box mark 7 as aforementioned. Since this may result in a reduced precision in determining the center position of the substrate box mark, the present focusing method mentioned just above is also advantageous, to thereby obviating difficulties encountered in prior methods.

According to the present disclosure, therefore, an overlay target and a method therewith are provided, capable of determining the precision of mask alignment with an improved reproducibility in optical lithography processes during semiconductor device fabrications.

While specific dimensions and shapes of the two boxes have been specified above, it is possible to have different lengths for the sides of the two boxes, and to have one or both boxes shaped as non-square polygons, so long as suitable adjustments are made in the calculations of $X_{req}$ and $Y_{reg}$ to account for different geometries. Further, it is possible to use a coordinate system other than the X, Y system, with appropriate adjustments in the calculations of displacement between the centers of the boxes.

Additional modifications and variations are possible in light of the above teachings. It is therefore to be understood that within the scope of the appended claims, the invention may be practiced otherwise than as specifically described herein.

What is claimed is:

1. An overlay target for precision measurement, comprising:

a substrate box formed as a square over or in a substrate;

a top box comprising a photo-resist layer, formed over said substrate box and substrate;

said top box being similar in shape to said substrate box, disposed such that the former is rotated by 45° with respect to the latter, the centers of both said boxes being aligned to coincide with each other to thereby result in a minimal amount of displacement, if any, between the centers, wherein the precision measurement is carried out for the length of a plurality of sections which are defined by the overlap between said substrate box and top box.

2. A method of determining the precision of mask alignment, comprising the steps of:

providing an overlay target, including a substrate box formed as a square over or in a substrate and a top box comprising a photo-resist layer, formed over said substrate box and substrate; said top box being similar in shape to said substrate box, disposed such that the former is rotated by 45° with respect to the latter, the centers of both said boxes being aligned to coincide with each other to thereby result in a minimal amount of displacement, if any, between the centers;

measuring the lengths of a plurality of sections that are defined by the overlap between said substrate box and top box;

calculating an amount of displacement in the pattern registration along the x-axis, from differences between two lengths measured for a confronting couple of said sections on the x-axis, and calculating another amount of displacement in the pattern registration along the y-axis, from differences between two lengths measured for another confronting couple of said sections on the y-axis.

3. The method according to claim 2, wherein said top box is formed as a square opening over said substrate pattern and lengths of the confronting sections are measured by focusing on said substrate box.

4. The method according to claim 2, wherein amounts of displacement in the pattern registration, $X_{reg}$ and $Y_{reg}$ along the x- and y-axes, respectively, are determined according to the following relationships, $$X_{reg}=(b-a)/4 \text{ and } Y_{reg}=(d-c)/4,$$

wherein b and a are the lengths of confronting sections on the x-axis, and wherein d and c are similarly the lengths of confronting sections on the y-axis.

5. The method according to claim 3, wherein a top box is formed as a square opening over said substrate box and lengths of confronting sections are measured by focusing on said substrate box.

6. A method of determining an alignment of masks in a manufacturing process involving the masking and exposure of layers over a substrate, comprising:

forming a first polygonal shape and a second polygonal shape, wherein one of the shapes is at a substrate and the other shape is at a layer overlying the substrate, and one of the shapes overlies the other shape such that only portions of side edges of one of the shapes coincide with an area of the other shape;

measuring the lengths of said portions of side edges of one of the shapes that coincide with the area of the other shape to derive measured lengths; and calculating a relative displacement between the two shapes from said measured lengths.

7. A method as in claim 6 in which all edges of one of the shape are non-parallel to the all edges of the other shape.

8. A method as in claim 7 in which the two shapes have substantially same areas.

9. A method as in claim 8 in which the two shapes are square.

10. A method as in claim 9 in which the two shapes are disposed such that when the centers thereof coincide, the area that the shapes occupy is an 8-pointed star in which adjacent peaks are angularly spaced by 45 degrees.

11. An overlay target for a precision measurement of mask alignment comprising:

a substrate having a surface irregularity comprising a lower polygon;

a layer formed over the substrate and said lower polygon and having an irregularity comprising an upper polygon;

the upper polygon overlying only a part of the lower polygon such that only a part of each edge of the upper polygon overlies the area of the lower polygon;

wherein a difference in length of said edges between the edge at a first side of said lower polygon versus the edge at a second side thereof that is opposite the first side is indicative of a relative displacement between centers of the upper and lower polygons in one direction, and a difference in length of said edges between the edge at a third side of said lower polygon versus the edge at a fourth side thereof that is opposite said third side is indicative of a relative displacement of said centers in another direction.

12. An overlay target as in claim 11 in which each of the upper and lower polygons is square in shape and the areas of the two polygons are the same, and when the centers of the two polygons coincide, the area the polygons occupy is an 8-pointed star in which the adjacent peaks are 45 degrees apart from each other.

* * * * *